US010686412B2

(12) United States Patent
Adut (10) Patent No.: US 10,686,412 B2
(45) Date of Patent: Jun. 16, 2020

(54) TRANS-IMPEDANCE AMPLIFIER WITH FAST OVERDRIVE RECOVERY (71) Applicant: LINEAR TECHNOLOGY CORPORATION, Milpitas, CA (US)

(72) Inventor: Joseph Adut, Palo Alto, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 213 days.

(21) Appl. No.: 15/473,533

(22) Filed: Mar. 29, 2017

(65) Prior Publication Data
US 2018/0284272 A1    Oct. 4, 2018

(51) Int. Cl.
H03F 3/08      (2006.01)
G01S 17/10     (2020.01)
G01S 7/487     (2006.01)
H03F 3/45      (2006.01)
G01S 7/4861    (2020.01)
G01S 7/497     (2006.01)
H03F 3/343     (2006.01)
H03F 1/08      (2006.01)

(52) U.S. Cl.
CPC .............. H03F 3/08 (2013.01); G01S 7/487 (2013.01); G01S 7/4861 (2013.01); G01S 7/497 (2013.01); G01S 17/10 (2013.01); H03F 1/083 (2013.01); H03F 3/087 (2013.01); H03F 3/3432 (2013.01); H03F 3/45475 (2013.01); H03F 2203/45528 (2013.01)

(58) Field of Classification Search
CPC .................................... H03F 3/04; H03F 3/08
See application file for complete search history.

(56) References Cited

U.S. PATENT DOCUMENTS

| 4,714,896 | A  |   | 12/1987 | Addis |
| 4,808,858 | A  |   | 2/1989 | Stoops |
| 5,532,471 | A  |   | 7/1996 | Khorramabadi et al. |
| 5,708,392 | A  |   | 1/1998 | Gross |
| 2003/0016084 | A1 | * | 1/2003 | Scott ........................ H03F 3/08 330/308 |
| 2006/0012902 | A1 |   | 1/2006 | Sharifi |
| 2008/0074198 | A1 |   | 3/2008 | Ohnishi |
| 2012/0281991 | A1 | * | 11/2012 | Sugimoto ............... H03F 3/087 398/208 |
| 2017/0026011 | A1 | * | 1/2017 | Khaw ..................... H03F 3/082 |
| 2018/0275250 | A1 | * | 9/2018 | Adut ..................... G01S 7/4816 |

FOREIGN PATENT DOCUMENTS

| CN | 108696256 A | 10/2018 |
| JP | 51113555 A | 10/1976 |
| JP | 02146809 A | 6/1990 |
| JP | 0794955 A | 4/1995 |
| JP | 2017032355 A | 2/2017 |

OTHER PUBLICATIONS

"Chinese Application Serial No. 201810267634.1, Voluntary Amendment Filed Feb. 14, 2019", w/ English Claims, 10 pgs.
"Japanese Application Serial No. 2018-061954, Notification of Reasons for Rejection dated Aug. 26, 2019", w/ English Translation, 10 pgs.

* cited by examiner

Primary Examiner — Luke D Ratcliffe
(74) Attorney, Agent, or Firm — Patent Capital Group (57) ABSTRACT A high-speed low-noise trans-impedance amplifier (TIA) with fast overdrive recovery is suitable for use in light detection and ranging (LIDAR) receivers.

20 Claims, 6 Drawing Sheets

TRANS-IMPEDANCE AMPLIFIER WITH FAST OVERDRIVE RECOVERY

BACKGROUND OF THE INVENTION

1. Field of the Invention

The present invention relates to trans-impedance amplifiers ("TIAs"). In particular, the present invention relates to TIAs that are configured to recover quickly after being driven beyond their linear ranges.

2. Discussion of the Related Art

Figure 1A:
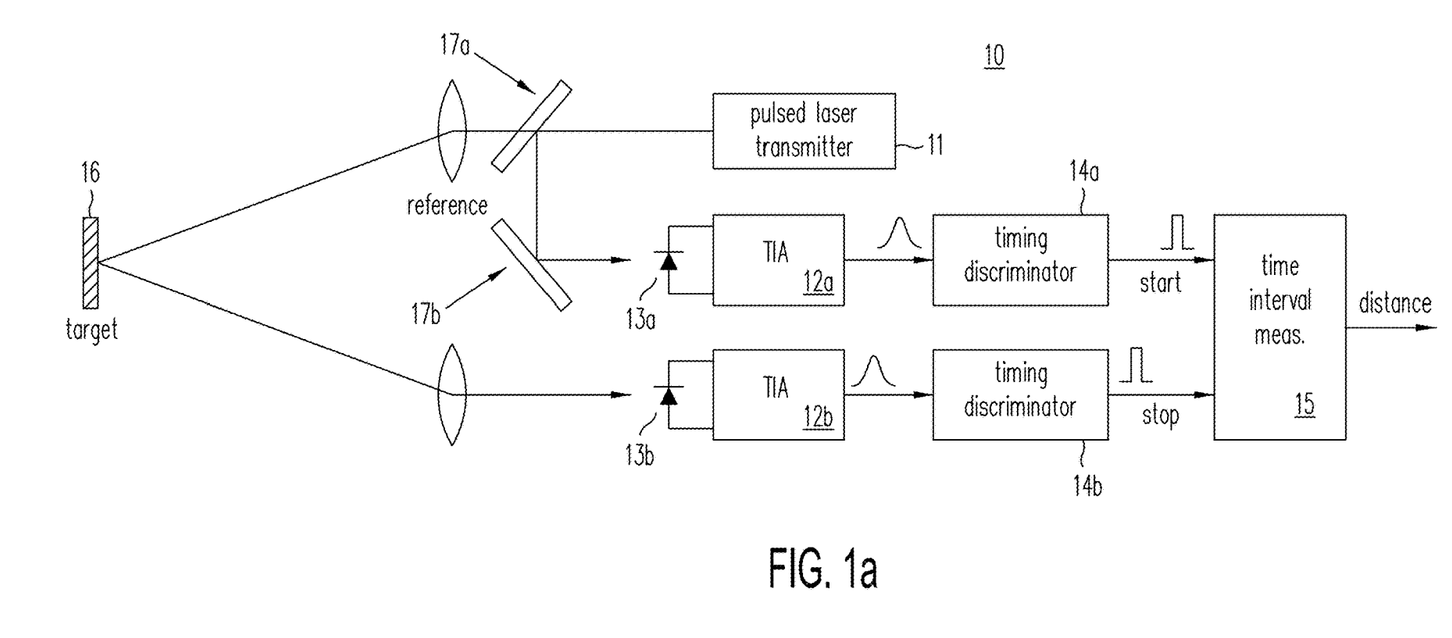
FIG. 1(a) is a block diagram illustrating the principles of operation in a conventional LIDAR system 10.

Light Detection and Ranging (LIDAR) systems have been used in new automotive applications, such as Advanced Driver Assistance Systems (ADAS). A LIDAR system measures a distance to a target by measuring a time difference between emitting a short laser pulse towards the target and detecting the reflection of the emitted laser pulse from the target. The distance to the target is then determined from the time difference. FIG. 1(a) is a block diagram illustrating the principles of operation of a conventional LIDAR system 10. As shown in FIG. 1(a), pulsed laser transmitter 11 emits a short laser pulse towards target 16. Through a reflection in optical system 17a of LIDAR system 10 the emitted pulse is detected at a first detection channel, which includes avalanche photo-diode (APD) 13a, TIA 12a and timing discriminator 14a. Upon detecting the emitted laser pulse, timing discriminator 14a provides a "start pulse" to timing interval measurement circuit 15. Some amount of time later, a reflection of the laser pulse from target 16 is received into LIDAR system 10 through optical system 17b into a second detection channel, which includes APD 13b, TIA 12b and timing discriminator 14b. Upon detecting the reflected laser pulse from target 16 in this second detection channel, timing discriminator 14b provides a "stop pulse" to timing interval measurement circuit 15. Based on the time difference between the "start" and "stop" pulses, time interval measurement circuit 15 provides an estimate of the distance between LIDAR system 10 and target 16.

Commercial off-the-shelf (COTS) TIAs that are especially developed for fiber-optics communication systems are often also used in a LIDAR system. However, to improve detection range, APDs (e.g., APDs 13a and 13b of FIG. 1(a)) are preferred in a LIDAR system because of their higher current gains relative to photo-diodes used in a conventional fiber-optics communication system.

Figure 1B:
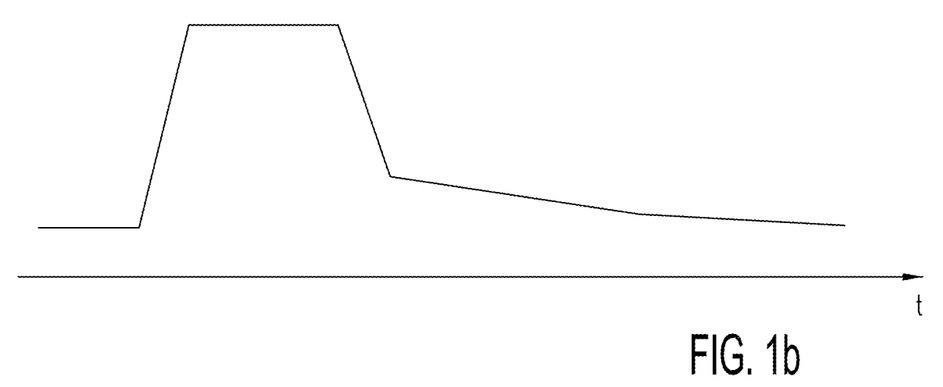
FIG. 1(b) shows a TIA output signal in a LIDAR detection channel when a single laser pulse is emitted towards a highly reflective target.
Figure 1C:
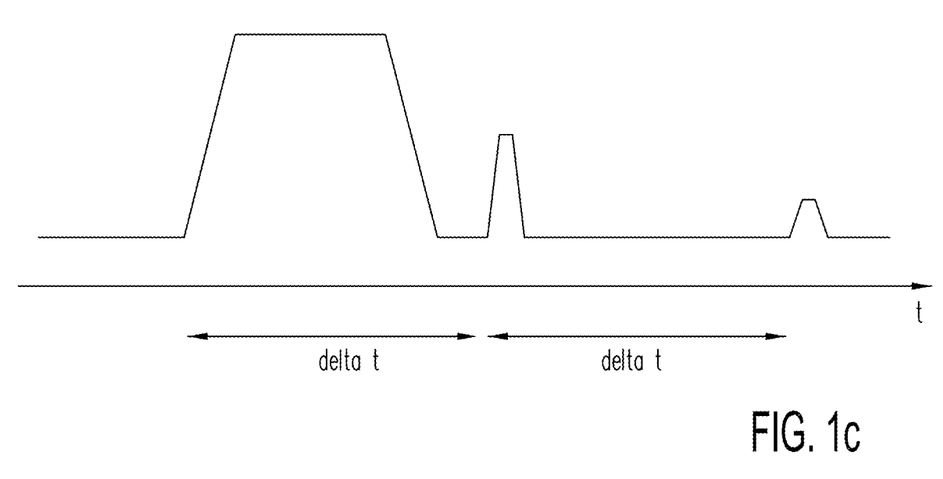
FIG. 1(c) shows desirable detections of additional reflections of the same emitted laser pulse in a TIA with a sufficiently fast overdrive recovery.

A LIDAR system typically operates under an environment that is less controlled than a fiber-optics communication channel. Specifically, TIAs in a LIDAR system are often subject to large but short transient current pulses. However, such a large current pulse may overdrive the TIA (e.g., TIAs 12a or 12b of FIG. 1(a)) beyond its linear range, such that the detection channel of the overdriven TIA may be blinded until the TIA fully recovers, long after the short but large current pulse is removed. FIG. 1(b) shows a TIA output signal in a LIDAR detection channel in response to a single laser pulse being emitted towards a highly reflective target. As shown in FIG. 1(b), a large transient current pulse results from the APD of the detection channel overdriving the associated TIA beyond its linear range. Because of the TIA's slow overdrive recovery, additional reflections from the same target (e.g., by way of other signal paths) cannot be detected. FIG. 1(c) shows desirable detections in a TIA of additional reflections of the same emitted laser pulse, when the TIA has a sufficiently fast overdrive recovery time. In FIG. 1(c), with sufficiently fast overdrive recovery, the TIA detects a second reflection and a third reflection that are spaced roughly equally in time from the same target.

Under an overdrive signal condition, when an amplifier is driven beyond a linear range, one or more transistors in the amplifier may saturate or cut off. Recovery from this non-linear operating condition may be delayed because of the internal charging or discharging of inherent or parasitic capacitances. See, e.g., U.S. Pat. No. 4,714,896 ("Addis") to J. L. Addis, entitled "Precision Differential Amplifier Having Fast Overdrive Recovery," issued on Dec. 22, 1987. Addis discloses a method for voltage amplifiers in which critical transistors are kept out of the saturation region during an overdrive signal condition. The voltage amplifier recovers quickly and operates immediately in its linear region once the overdrive signal condition is removed. A method with a similar result is desired for TIAs.

Figure 2A:
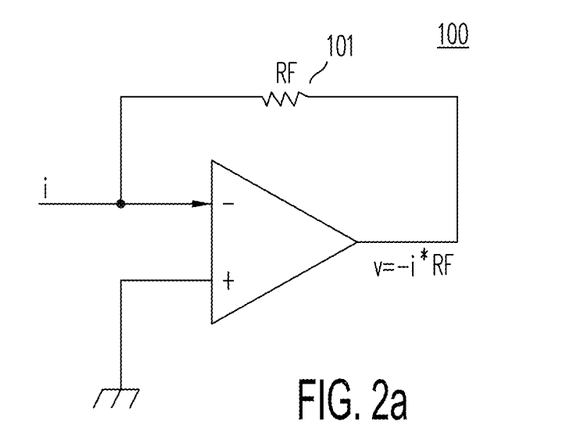
FIG. 2(a) is a block diagram of conventional trans-impedance amplifier 100, whose trans-impedance gain is determined by the resistance RF of resistor 101.
Figure 2B:
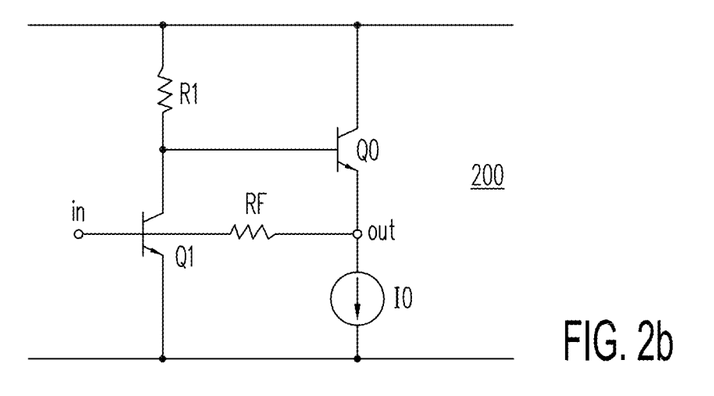
FIG. 2(b) shows conventional TIA 200, which includes a common-emitter input stage and a common-collector output stage.

FIGS. 2(a) and 2(b) provide examples of conventional TIAs. FIG. 2(a) is a block diagram of conventional TIA 100, whose trans-impedance gain is determined by the resistance RF of resistor 101 (i.e., G=V/I=−RF). FIG. 2(b) shows conventional TIA 200, which includes a common-emitter input stage and a common-collector output stage. One method for reducing the overdrive recovery time in a TIA (e.g. a TIA that is used in a fiber-optic receiver) is to limit the gain of the TIA during the overdrive condition, which extends the TIA's linear input range.

Figure 3:
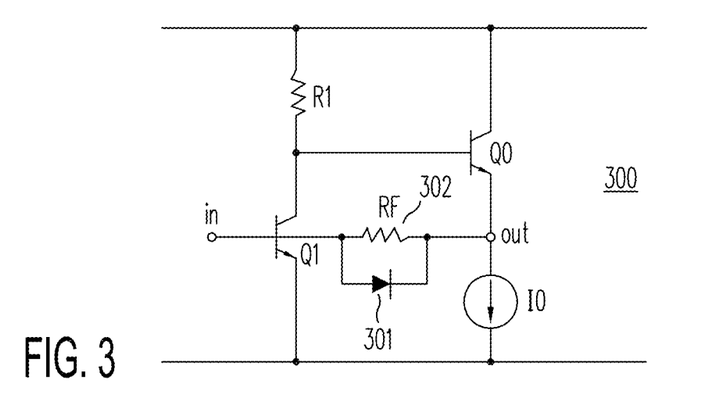
FIG. 3 shows TIA circuit 300 that includes diode 301 that clamps the voltage across feedback resistor 302.
Figure 4:
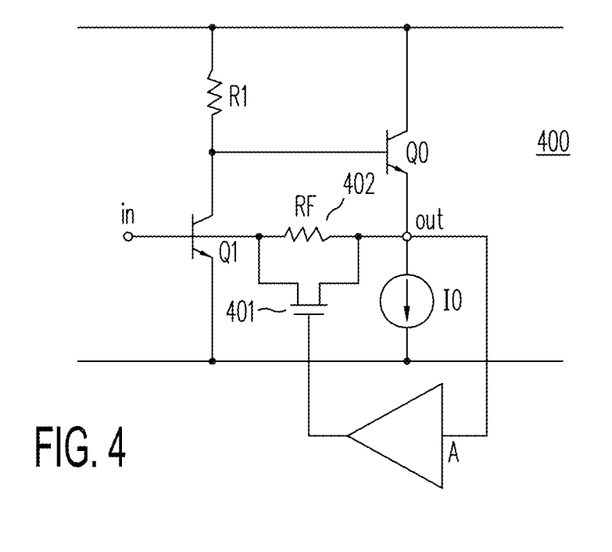
FIG. 4 shows TIA circuit 400 which includes MOSFET 401 across feedback resistor 402.

U.S. Pat. No. 5,708,392 ("Gross"), entitled "Method and Apparatus For Providing Limiting Transimpedance Amplification," to W. A. Gross., issued on Jan. 13, 1998, discloses using a diode to clamp the voltage across the feedback resistor in a TIA circuit. For example, FIG. 3 shows TIA circuit 300 that includes diode 301 that clamps the voltage across feedback resistor 302. Such a diode clamp circuit compresses the gain under an overdrive signal condition. As a second example, FIG. 4 shows TIA circuit 400 which includes MOSFET 401 across feedback resistor 402. (See, e.g., U.S. Pat. No. 5,532,471 ("Khorramabadi"), entitled "Optical transimpedance amplifier with high dynamic range," to H. Khorramabadi, M. J. Tarsia, and L. D. Tzeng, issued on Jul. 2, 1996.) As shown in FIG. 4, upon detection of a large input signal, MOSFET 401 is switched on by a feedback signal from amplifier A, so as to increase the signal handling capability of TIA 400. Providing a by-pass circuit across the feedback resistor in a TIA, as illustrated by FIGS. 3 and 4, is not sufficiently fast for light detecting and ranging ("LIDAR") receiver applications.

SUMMARY

According to one embodiment of the present invention, a light detecting and ranging (LIDAR) system includes two or more detection channels, in which each detection channel has an avalanche photo-diode (APD) for sensing light to provide an input signal, a trans-impedance amplifier (TIA) for amplifying the input signal and a timing discriminator for detecting an event in the amplified input signal. According to the present invention, the TIA may be provided by a low-noise high-speed TIA with a current signal limiter that facilitates fast overdrive recovery. In one embodiment, the TIA includes (a) an input stage including a common-emitter configured transistor, in which the base terminal of the common-configured transistor is coupled to an input terminal of the TIA; (b) an output stage including a common-base configured transistor, in which the collector terminal of the common-base configured transistor is coupled to an output terminal of the TIA and the base terminal of the common-base configured transistor receives a first bias voltage; (c) a resistor coupled between the input and output terminals of the TIA; and (d) a current limiting circuit, the current limiting circuit includes a programmable current source coupled to the emitter terminal of the common-base configured transistor and a diode matrix coupled between the emitter terminal of the common-base configured transistor and the collector terminal of the common-emitter configured transistor. The diode matrix limits the emitter current of the common-base configured transistor, so as to limit the voltage at the output terminal of the TIA to a maximum value. So limited, the common-base configured transistor operates in a linear region even under an overdrive signal condition at the input terminal of the TIA.

In one embodiment, the input stage is part of a differential input stage having a current source that limits the emitter current in the common-emitter configured transistor. The differential input stage may include a second common-emitter configured transistor having a base terminal that receives a second bias voltage.

According to one embodiment of the present invention, the TIA may include a voltage clamp circuit that maintains the input terminal of the TIA at no less than a first predetermined voltage or no greater than a second predetermined voltage. Either predetermined voltage may be a reference voltage. The clamp circuit may be implemented by a diode, an MOS transistor, or by a bipolar transistor.

The present invention is better understood upon consideration of detailed description below in conjunction with the accompanying drawings.

BRIEF DESCRIPTION OF THE DRAWINGS

To facilitate cross-referencing among the figures, like elements are provided like reference numerals.

DETAILED DESCRIPTION OF THE PREFERRED EMBODIMENTS

The present invention provides a low-noise high-speed TIA with a current signal limiter to facilitate fast overdrive recovery.

Figure 5:
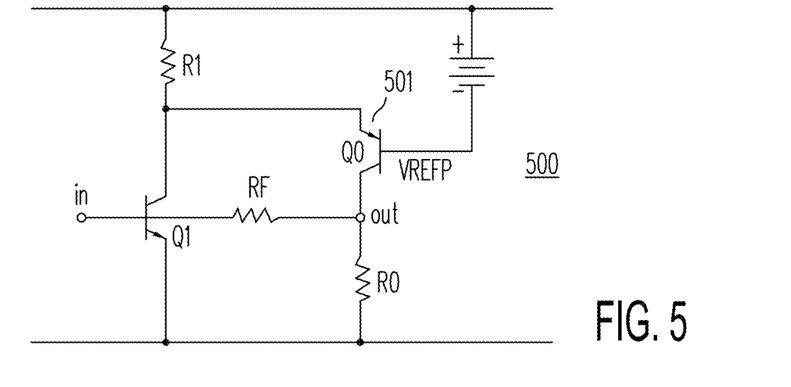
FIG. 5 shows such a low-noise folded cascode TIA 500 with a SiGe PNP transistor 501.

The common-collector output stage of conventional TIA 200 of FIG. 2(b) recovers slowly from an overdrive condition when a negative input current is present that is of a sufficiently large amplitude. However, a modern complementary SiGe process may provide fast PNP transistors that allows a low-noise folded cascode TIA to achieve similar bandwidths as conventional TIA 200. FIG. 5 shows low-noise folded cascode TIA 500 with a SiGe PNP transistor 501 biased by a fixed reference voltage $V_{REFP}$. According to one embodiment of the present invention, the collector current in common-base PNP transistor 501 of TIA 500 can be conditioned using a programmable linear signal limiter, as discussed below. Such a TIA—where the common-base transistor can be kept out of the saturation region during an overdrive condition—recovers quickly.

Figure 6:
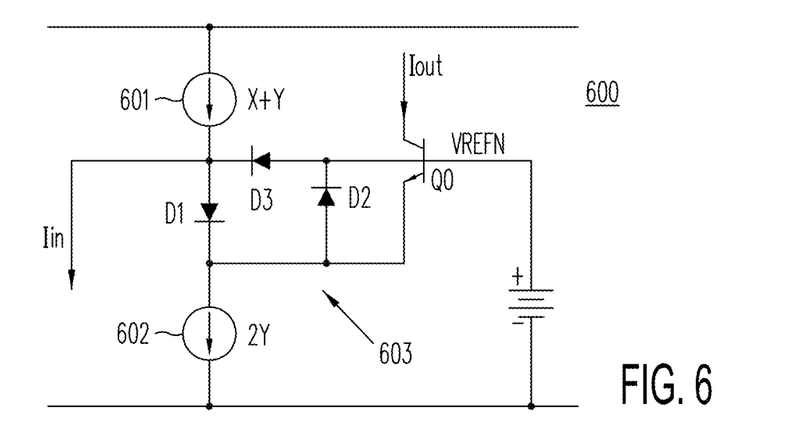
FIG. 6 illustrates the operation of NPN common-base stage 600, which includes NPN transistor 601 that provides an output current which is linear within a limited specific range.

U.S. Pat. No. 4,808,858 ("Stoops"), entitled "Dual Limit Programmable Linear Signal Limiter," to J. F. Stoops, issued on Feb. 28, 1989, discloses an NPN common-base stage which provides an output current that is linear within a limited specific range, but can absorb a considerably larger input current. Based on the teachings in Stoops, FIG. 6 illustrates the operation of an example NPN common-base stage 600, which includes NPN transistor 601 that provides an output current that is linear within a limited specific range. In FIG. 6, programmable current sources 601 and 602 and diode matrix 603 (formed by diodes D1, D2, and D3) together provide a current limiting mechanism. In FIG. 6, NPN transistor 601 is biased by a fixed biased voltage $V_{REFN}$. As shown in FIG. 6, programmable current sources 601 and 602 are set to provide currents X+Y and 2Y respectively, for suitable X and Y values. Output current $I_{out}$—the common-base collector current—ranges from 0 to 2Y.

At minimum output current, i.e., $I_{out}=0$, the corresponding input current $I_{in}$ is given by (X−Y−dI), for a base current dI. In this regime, diode D3 is not conducting. As input current $I_{in}$ increases from (X−Y−dI) to (X−Y+dI), output current $I_{out}$ increases linearly from 0 to dI, with the current in diode D1 increases from (−2Y−dI) to (2Y−dI), at which point diode D2 ceases to conduct and diode D3 is turned on. As input current $I_{in}$ increases from (X−Y+dI) to (X+Y+dI), output current $I_{out}$ increases linearly from dI to 2Y, with the current in diode D1 decreases from (2Y−dI) to 0, while the current in diode D3 increases from 0 to dI. Table I below summarizes the common-base collector current $I_{out}$ and the currents in diodes D1, D2 and D3 of the diode matrix, versus input current $I_{in}$:

| Region | Input Current | Output Current | Current in D1 | Current in D2 | Current in D3 |
|---|---|---|---|---|---|
| Minimum current limit | X − Y − dI | 0 | −2Y − dI | dI | 0 |
| Linear range | X − Y + dI | dI | 2Y − dI | 0 | 0 |
| Maximum current limit | X + Y + dI | 2Y | 0 | 0 | dI |

Figure 7:
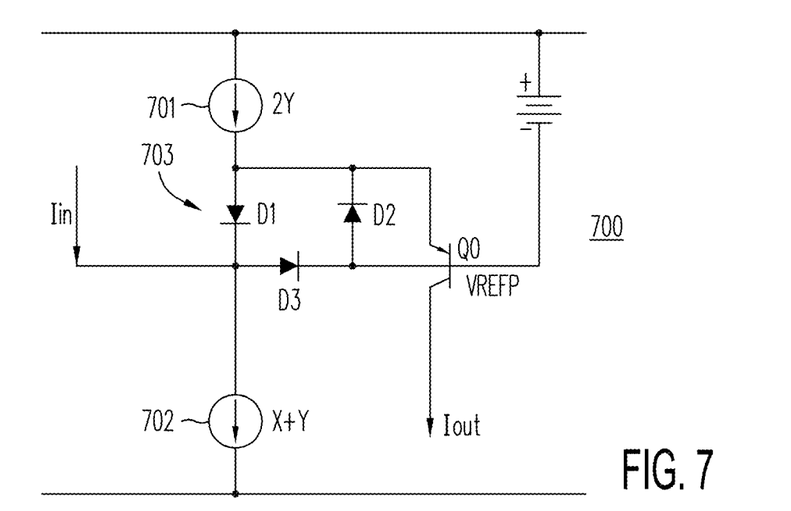
FIG. 7 illustrates the operation of PNP common-base stage 700, which includes PNP transistor Q0 with an output current that is linear within a limited specific range, similar to that illustrated for NPN common-base stage 600 of FIG. 6.

The method illustrated by the NPN common-base stage of FIG. 6 may be adapted for a PNP common-base stage, such as that shown in FIG. 7. FIG. 7 illustrates the operation of PNP common-base stage 700, which includes PNP transistor Q0 with an output current that is linear within a limited specific range. In FIG. 7, PNP transistor Q0 is biased by a fixed bias voltage $V_{REFP}$ and provided a diode matrix including diodes D1, D2 and D3 for the current limiting operation. FIG. 7 is a configuration that is suitable for use in LIDAR receiver applications, in which it is common to couple an APD to the input terminal of TIA 700 to provide a unipolar negative current output pulse. The current-limiting operation of PNP common-base stage 700 of FIG. 7 is substantially the same as that illustrated for NPN common-base stage 600 by FIG. 6, described above, and summarized in Table I above.

Figure 8:
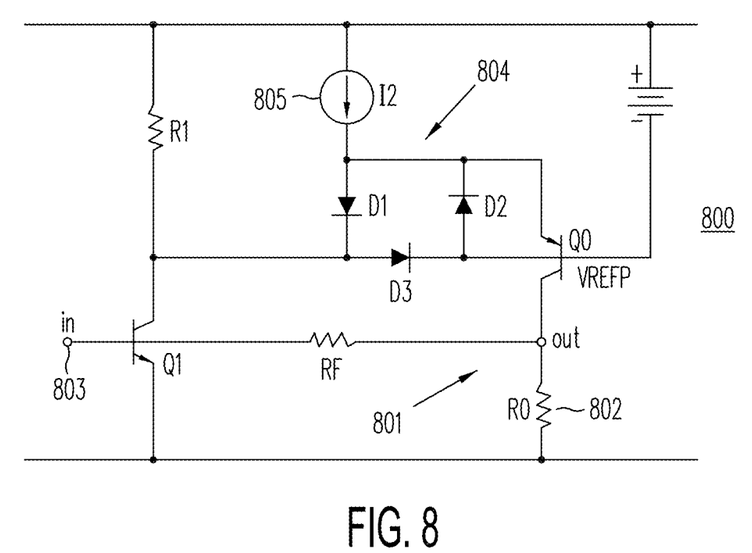
FIG. 8 shows folded cascode amplifier 800, which incorporates PNP common-base stage 801 with programmable current limiter implemented by current source 805 and diode matrix 804, in accordance with one embodiment of the present invention.

FIG. 8 shows folded cascode trans-impedance amplifier 800, which incorporates PNP common-base stage 801 with a programmable current limiter implemented by current source 805 (with current I2) and diode matrix 804, in accordance with one embodiment of the present invention. As shown in FIG. 8, the maximum collector current in transistor Q0 can be limited by programmable current source 805 and diode matrix 804 (implemented by diodes D1, D2 and D3) to maintain the maximum output voltage across resistor 802 to below the reference bias voltage $V_{REFP}$ at the base terminal of transistor Q0, when an input current pulse with a sufficiently large amplitude is applied to input terminal 803. With transistors Q0 and Q1 kept out of their respective saturation regions under overdrive conditions, TIA 800 recovers very quickly immediately following removal of the large input current pulse from input terminal 803. As diode matrix 804 does not degrade the speed or the noise performance of low-noise, high-speed folded cascode TIA 800, the resulting fast overdrive recovery makes TIA 800 suitable for LIDAR receiver applications.

Figure 9:
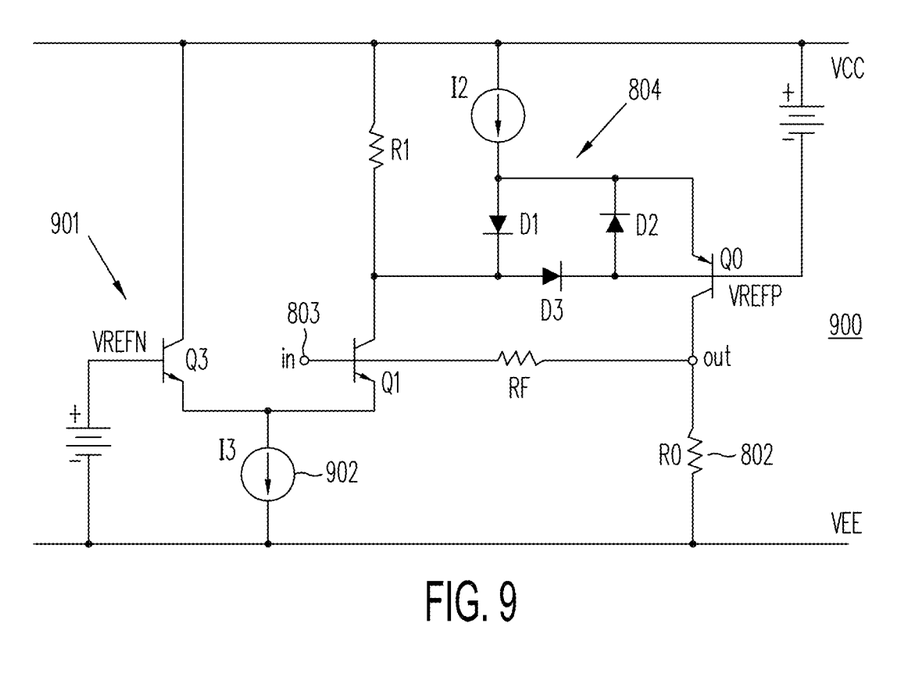
FIG. 9 shows folded cascode TIA 900 with a differential input stage that includes common-emitter transistor Q1, programmable current source 902 and reference biased common-emitter transistor Q3, in accordance with one embodiment of the present invention.

In addition to keeping the common-base transistor Q0 of the folded cascode TIA out of the saturation region when a negative pulse is applied, it is also desirable to keep transistor Q1 at the common-emitter input stage of the TIA out of saturation as well, when a unipolar positive current input pulse is present. One approach is to make transistor Q1 part of a differential pair. FIG. 9 shows folded cascode TIA 900 with a differential input stage that includes common-emitter transistor Q1, programmable current source 902 and reference biased transistor Q3, in accordance with one embodiment of the present invention. Transistor Q3 is biased by reference voltage $V_{REFN}$. In this configuration, current source 902 (with current I3) sets the maximum emitter current in transistors Q1 and Q3. With suitable selections in folded cascode TIA 900 of bias voltages $V_{REFP}$ and $V_{REFN}$, bias currents I2 and I3 and resistor values R0, RF and R1, both transistors Q0 and Q1 can be kept out of the saturation, so that fast overload recovery under both positive and negative input currents may be achieved.

Figure 10:
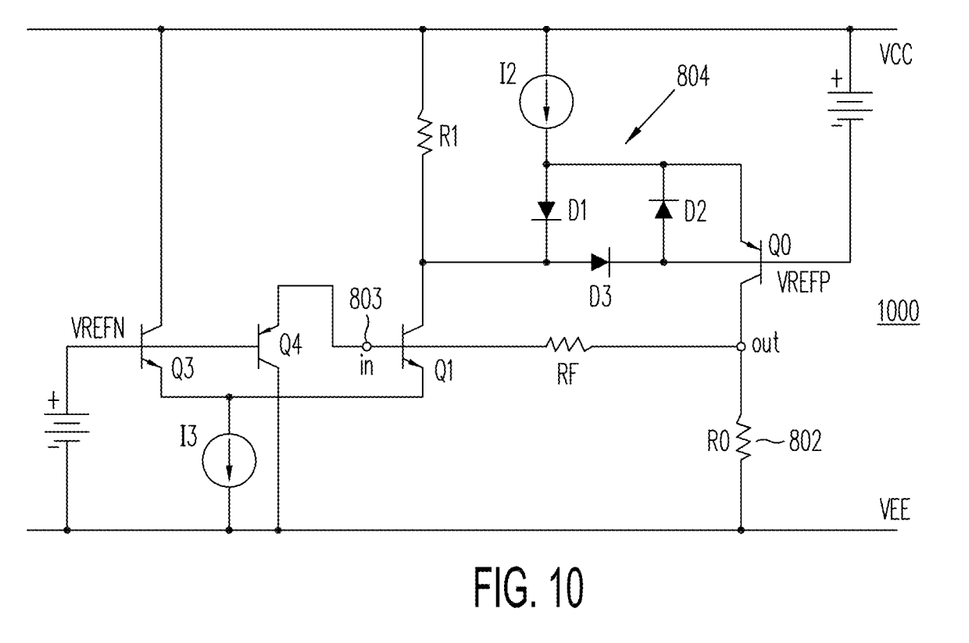
FIG. 10 shows TIA 1000 in which PNP transistor Q4 is provided as a voltage clamp at input terminal 803, in accordance with one embodiment of the present invention.
Figure 11:
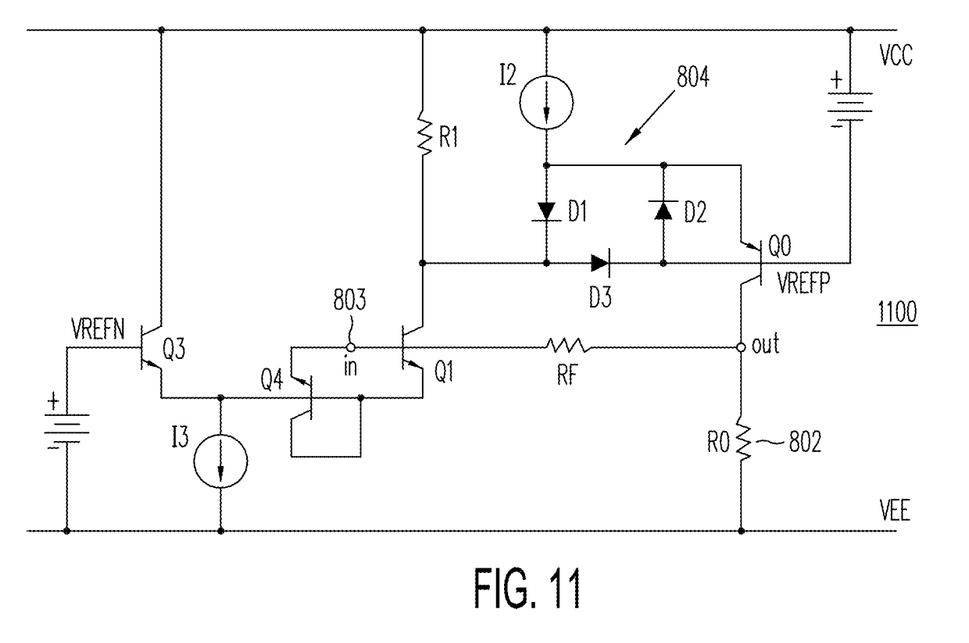
FIG. 11 shows TIA 1100 in which diode-connected PNP transistor Q4 is provided as a voltage clamp at input terminal 803, in accordance with one embodiment of the present invention.

A voltage clamp circuit may be provided to folded cascode TIA 900 to prevent the voltage at input terminal 803 from going below the negative supply $V_{EE}$. FIG. 10 shows folded cascade TIA 1000 in which PNP transistor Q4 is provided as a voltage clamp circuit at input terminal 803, in accordance with one embodiment of the present invention. Alternatively, the voltage clamp circuit may be provided by a diode-connected NPN transistor, such as illustrated in folded cascade TIA 1100 of FIG. 11 by diode-connected NPN transistor Q4.

The above detailed description is provided to illustrate specific embodiments of the present invention and is not intended to be limiting. Numerous variations and modifications within the scope of the present invention are possible. The present invention is set forth in the accompanying claims.

I claim:

1. A system comprising a trans-impedance amplifier (TIA) having an input terminal and an output terminal, the TIA comprising:
   a common-emitter configured transistor having a collector terminal and a base terminal, the base terminal of the common-emitter configured transistor coupled to the input terminal of the TIA;
   a common-base configured transistor having an emitter terminal, a collector terminal and a base terminal, the collector terminal of the common-base configured transistor coupled to the output terminal of the TIA and the base terminal of the common-base configured transistor coupled to receive a first bias voltage; and
   a diode matrix coupled between the emitter terminal of the common-base configured transistor and the collector terminal of the common-emitter configured transistor.

2. The system according to claim 1, wherein the diode matrix is configured to limit the emitter current of the common-base configured transistor.

3. The system according to 1, wherein the common-emitter configured transistor is part of a differential input stage.

4. The system according to claim 3, wherein the differential input stage comprises a current source coupled to an emitter terminal of the common-emitter configured transistor.

5. The system according to claim 3, wherein the differential input stage further comprises a second common-emitter configured transistor having a base terminal coupled to receive a second bias voltage.

6. The system according to claim 1, wherein the TIA further comprises a voltage clamp circuit configured to maintain the input terminal of the TIA at no less than a first predetermined voltage or no greater than a second predetermined voltage.

7. The system according to claim 6, wherein the TIA is coupled between first and second supply voltages and wherein the first and second predetermined voltages may each be one of the supply voltages or a reference voltage.

8. The system according to claim 6, wherein the voltage clamp circuit comprises a diode or a bipolar transistor.

9. The system according to claim 1, wherein the common-base configured transistor comprises a SiGe PNP transistor.

10. The system according to claim 1, further comprising a current source coupled to the emitter terminal of the common-base configured transistor.

11. The system according to claim 10, wherein the current source is a programmable current source.

12. The system according to claim 1, further comprising a resistor coupled between the input terminal and the output terminal of the TIA.

13. The system according to claim 1, further comprising an additional transistor having an emitter terminal coupled to the input terminal of the TIA and further having a collector terminal coupled to emitter terminal of the common-emitter configured transistor.

14. The system according to claim 13, wherein:
the common-emitter configured transistor is part of a differential input stage, and
the differential input stage further includes one or more of:
a current source coupled to an emitter terminal of the common-emitter configured transistor, and
a second common-emitter configured transistor having a base terminal coupled to receive a second bias voltage.

15. The system according to claim 1, wherein the diode matrix includes a first diode, a second diode, and a third diode, each of which includes a first terminal and a second terminal, and wherein:
the first terminal of the first diode is coupled to the second terminal of the second diode,
the second terminal of the second diode is further coupled to the emitter terminal of the common-base configured transistor,
the second terminal of the first diode is coupled to each of the first terminal of the third diode and the collector terminal of the common-emitter configured transistor, and
the second terminal of the third diode is coupled to the first terminal of the second diode.

16. The system according to claim 1, wherein the input terminal of the TIA is configured to receive an input signal that is based on a signal generated by an avalanche photo-diode (APD) for sensing light.

17. The system according to claim 1, wherein the system is a light detecting and ranging (LIDAR) system, and wherein the system further includes one or more of:

an avalanche photo-diode (APD) for sensing light to provide an input signal to the input terminal of the TIA, and
a timing discriminator configured to detect an event in an output signal provided at the output terminal of the TIA.

18. A system comprising a trans-impedance amplifier (TIA) having an input terminal and an output terminal the TIA comprising:
a first transistor having a collector terminal and a base terminal, the base terminal of the first transistor coupled to the input terminal of the TIA;
a second transistor having an emitter terminal, a collector terminal and a base terminal, the collector terminal of the second transistor coupled to the output terminal of the TIA and the base terminal of the second transistor coupled to receive a first bias voltage; and
a diode matrix coupled between the emitter terminal of the second transistor and the collector terminal of the first transistor.

19. The system according to claim 18, wherein the diode matrix includes a first diode, a second diode, and a third diode, each of which includes a first terminal and a second terminal, and wherein:
the first terminal of the first diode is coupled to the second terminal of the second diode,
the second terminal of the second diode is further coupled to the emitter terminal of the second transistor,
the second terminal of the first diode is coupled to each of the first terminal of the third diode and the collector terminal of the first transistor, and
the second terminal of the third diode is coupled to the first terminal of the second diode.

20. The system according to claim 18, further comprising an additional transistor having an emitter terminal coupled to the input terminal of the TIA and further having a collector terminal coupled to emitter terminal of the first transistor.

* * * * *